US009560763B2

(12) United States Patent
Ogawa et al.

(10) Patent No.: US 9,560,763 B2
(45) Date of Patent: Jan. 31, 2017

(54) PACKAGE FOR OPTICAL MODULE

(71) Applicants: NIPPON TELEGRAPH AND TELEPHONE CORPORATION, Tokyo (JP); NTT ELECTRONICS CORPORATION, Yokohama-shi, Kanagawa (JP)

(72) Inventors: Ikuo Ogawa, Atsugi (JP); Ryoichi Kasahara, Atsugi (JP); Toshiki Nishizawa, Yokohama (JP); Yuji Mitsuhashi, Yokohama (JP)

(73) Assignees: Nippon Telegraph and Telephone Corporation, Tokyo (JP); NTT Electronics corporation, Yokohama-shi, Kanagawa (JP)

( * ) Notice: Subject to any disclaimer, the term of this patent is extended or adjusted under 35 U.S.C. 154(b) by 160 days.

(21) Appl. No.: 14/410,866

(22) PCT Filed: Jul. 1, 2013

(86) PCT No.: PCT/JP2013/004074
§ 371 (c)(1),
(2) Date: Dec. 23, 2014

(87) PCT Pub. No.: WO2014/006873
PCT Pub. Date: Jan. 9, 2014

(65) Prior Publication Data
US 2015/0334838 A1 Nov. 19, 2015

(30) Foreign Application Priority Data
Jul. 3, 2012 (JP) .................................. 2012-149506

(51) Int. Cl.
H05K 7/00 (2006.01)
H05K 1/18 (2006.01)
(Continued)

(52) U.S. Cl.
CPC ............. *H05K 1/181* (2013.01); *G02B 6/4279* (2013.01); *H05K 1/0274* (2013.01); *H05K 2201/10121* (2013.01)

(58) Field of Classification Search
CPC ..... G02B 6/4279; H01L 31/02; H05K 1/0274; H05K 1/181; H05K 2201/10121
See application file for complete search history.

(56) References Cited

U.S. PATENT DOCUMENTS 5,661,343 A 8/1997 Takahashi et al.
6,343,171 B1 * 1/2002 Yoshimura ......... G02B 6/12002
257/E23.01
(Continued)

FOREIGN PATENT DOCUMENTS

CN 1802581 7/2006
CN 203385898 1/2014
(Continued)

OTHER PUBLICATIONS

Office Action in corresponding Chinese Application No. 201310270780.7 dated Feb. 3, 2015.
(Continued)

Primary Examiner — Yuriy Semenenko
(74) Attorney, Agent, or Firm — Workman Nydegger

(57) ABSTRACT

A package for optical module includes a flat-plate-shaped metal base, and a ceramic circuit board in which a plurality of terminals are arranged in a longitudinal direction, and which is joined to an upper surface of the metal base by soldering. The ceramic circuit board has a shape change portion in which the ceramic circuit board is changed in shape along the longitudinal direction, and a region of the ceramic circuit board not including the shape change portion is joined to the metal base by soldering. The shape change portion of the ceramic circuit board is a portion where a width is changed along the longitudinal direction, or a
(Continued)

portion where a thickness is changed along the longitudinal direction.

5 Claims, 11 Drawing Sheets

(51) Int. Cl.
*H05K 1/02* (2006.01)
*G02B 6/42* (2006.01)

(56) References Cited

U.S. PATENT DOCUMENTS

| 2002/0172476 | A1 | 11/2002 | Nagase et al. | |
|---|---|---|---|---|
| 2012/0288242 | A1 | 11/2012 | Nishizawa et al. | |
| 2013/0101250 | A1* | 4/2013 | Desai | G02B 6/4257 385/14 |
| 2014/0341516 | A1* | 11/2014 | Mathai | G02B 6/4259 385/93 |
| 2016/0146440 | A1* | 5/2016 | Jeong | F21V 23/005 362/84 |

FOREIGN PATENT DOCUMENTS

| EP | 1220390 | 7/2002 |
|---|---|---|
| JP | 2002-343982 | 11/2002 |
| JP | 2004-146630 | 5/2004 |
| JP | 2008-306100 | 12/2008 |
| JP | 2011-188132 | 9/2011 |
| JP | 2011-193347 | 9/2011 |
| JP | 4934733 | 9/2011 |
| JP | 2012-242400 | 12/2012 |

OTHER PUBLICATIONS

International Search Report in corresponding Application No. PCT/JP2013/004074 dated Aug. 6, 2013.
International Preliminary Report on Patentability and Written Opinion in corresponding application No. PCT/JP2013/004074 dated Jan. 6, 2015.
Extended European Search Report (EESR) issued on Feb. 15, 2016 in correspondence European Application No. 13813785.6.

* cited by examiner

PACKAGE FOR OPTICAL MODULE

TECHNICAL FIELD

The present invention relates to a package for optical module.

BACKGROUND ART

In recent years, development of optical front-end modules for digital coherent receivers has been advancing. As optical front-end modules for receivers, there have been known modules described in Patent Literature 1, for example. A package used for such a module has been standardized in terms of a shape, pin layout and the like. A package is provided with DC leads in two opposed side faces thereof, i.e., 20 DC leads arranged at a pitch of 1.27 mm in each side face. In the package, one of side faces orthogonal to the two opposed side faces is provided with an optical input terminal and the other side face is provided with 20 RF leads arranged at a pitch of 1 mm.

As packages used for aforementioned modules, a metal package is often used in which ceramic circuit boards each having SMT leads are joined by being embedded in side wall faces of the package. For example, as illustrated in FIGS. 1A and 1B, a conventional package is often hermetically sealed in such a way that a lid being a flat plate lid (not illustrated) is seam-welded to a bathtub-shaped package base 10. As illustrated in FIG. 1A, the optical front-end module for receiver includes a waveguide optical element 20, an optical component 30, an optical semiconductor and electronic circuit 40, and the like, which are mounted inside the package 10. Moreover, two opposed side faces of the package 10 are provided with ceramic circuit boards 50 having multiple DC leads 60 connected thereto, and the side surfaces orthogonal to the two opposed side surfaces are provided with a fiber F and output terminals 70.

CITATION LIST

Patent Literature

PTL 1: Japanese Patent No. 4934733

SUMMARY OF INVENTION

Technical Problem

In the case of the bathtub-shaped package 10 illustrated in FIG. 1B, however, it is not easy to mount the optical component 30 inside the package 10. As illustrated in FIG. 1B, inside the bathtub-shaped package 10, an optical lens 31 of the optical component 30 is aligned, and then fixed to a lens carrier 32 by YAG laser welding L while being held. In this fixation, the welding has to be performed from an upper side at an angle unavoidably because the surrounding space is insufficient. The YAG laser welding, however, has a problem in that fixation accuracy is lowered when the welding is performed from the upper side at an angle. Accordingly, for the package illustrated in FIG. 1B, it has been difficult to lay out optical components at high density due to the necessity to leave the sufficient space inside the bathtub.

To address this issue, there has been also proposed a package in which a package base is formed in the shape of a flat plate instead of a bathtub shape as illustrated in FIGS. 2A and 2B. Use of a flat-plate-shaped package base 80 makes it easy to mount an optical component 30, and results in achievement of high-density layout of optical components 30 as illustrated in FIGS. 3A and 3B. For example, a 100-Gbit optical front-end module for digital coherent receiver has been standardized by OIF (the optical internetworking Forum), and this module includes a large number of components and requires high-density layout. The optical front-end module for digital coherent receiver standardized by OIF can be also configured by using the flat-plate-shaped package base 80. Even in the case of high-density layout, YAG laser welding L can be easily performed as illustrated in FIG. 3B.

Each of ceramic circuit boards 90 having SMT leads is provided with a wiring pattern where input from the leads is routed, and a pad for applying a bias and supplying DC voltage to an optical semiconductor and electronic circuit. In order to be connected by bonding to the optical semiconductor and electronic circuit 40 arranged on an output side in the package, the pad portions 92 of the ceramic circuit boards need to be arranged on both sides of these components. Since a region 40 where the optical semiconductor and electronic circuit are arranged has to occupy an area determined by constraints of high-frequency wiring, the pad portions 92 of the ceramic circuit boards 90 arranged on both sides of the region 40 need to be narrowed in width in some cases. On the other hand, since routing of a wiring pattern requires a certain size of area, a portion (routing portion) 91 other than a portion where the pad is provided is formed with a large width or is formed of a multilayer. Thus, with employment of high-density layout, each ceramic circuit board does not have a constant shape along a longitudinal direction.

The flat-plate-shaped package base 80 described above has stiffness lower than a stiffness of the bathtub shape having a monocoque structure. For this reason, as illustrated in FIG. 3A, the ceramic circuit board is joined at a dotted region, in other words, at an entire back face, to the package base 80. However, the joining of the entire surface of the ceramic circuit board 90 for electric wiring to the package base 80 entails a risk that, if thermal expansion occurs in soldering for board mounting, stress may be concentrated at a boundary portion between the routing portion 91 and the pad portion 92 of the ceramic circuit board 90 and a crack or the like may occur in the ceramic circuit board 90.

The present invention has been made in view of the foregoing problems, and an objective of the present invention is to provide an optical module package which is capable of achieving high-density layout, and is also made highly reliable by reducing stress concentration and thereby preventing occurrence of a crack in a ceramic circuit board when thermal expansion occurs.

Solution to Problem

In order to solve the foregoing problems, an invention according to claim 1 is a package for optical module including a flat-plate-shaped metal base; and a ceramic circuit board in which a plurality of terminals are arranged in a longitudinal direction, and which is joined to an upper surface of the metal base by soldering. The ceramic circuit board has a first portion in which the ceramic circuit board is changed in shape along the longitudinal direction, and a region of the ceramic circuit board not including the first portion is joined to the metal base by soldering.

An invention according to claim 2 is the package for optical module according to claim 1, in which the first portion of the ceramic circuit board is a portion where a width is changed along the longitudinal direction.

An invention according to claim 3 is the package for optical module according to claim 1, in which the first portion of the ceramic circuit board is a portion where a thickness is changed along the longitudinal direction.

An invention according to claim 4 is the package for optical module according to claim 1, in which a soldering material used for the soldering is a AuSn solder.

DESCRIPTION OF EMBODIMENTS

Figure 1A:
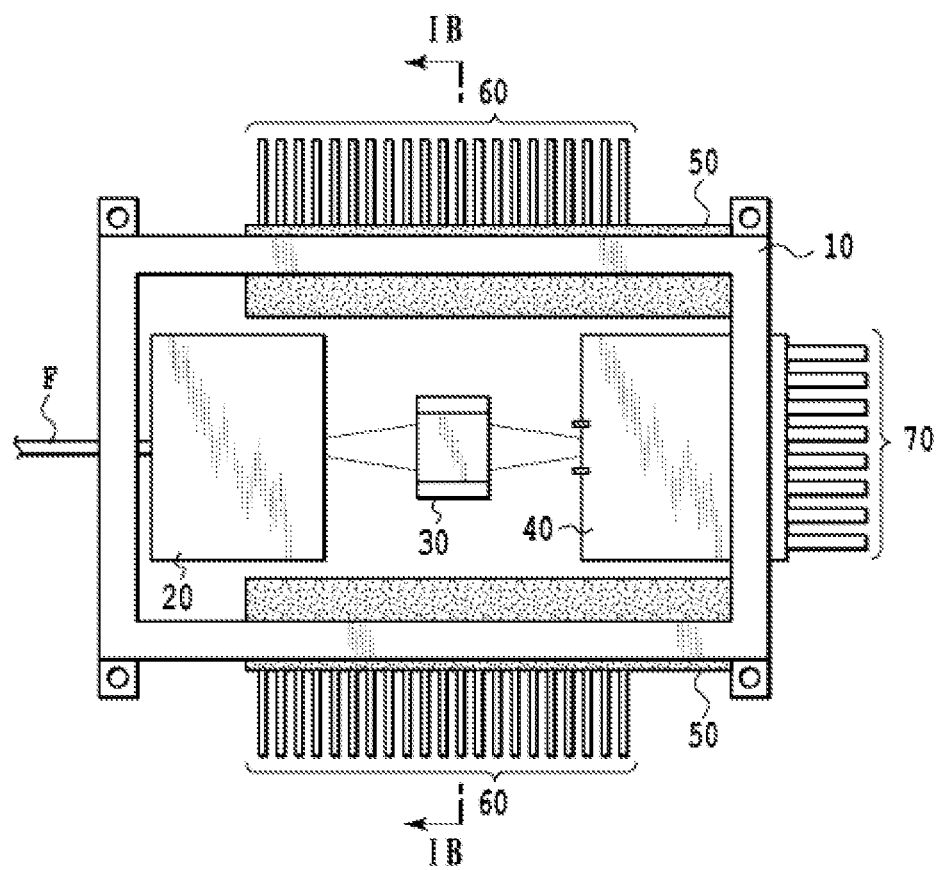
FIG. 1A is a view illustrating an optical module employing a conventional package for optical module.
Figure 1B:
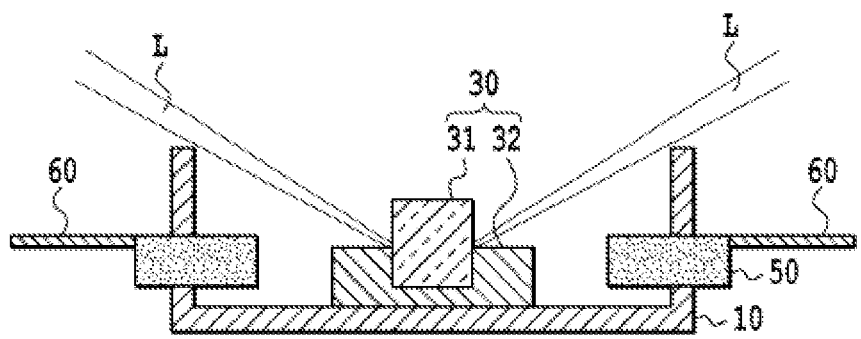
FIG. 1B is a IB-IB cross-sectional view of FIG. 1A.
Figure 2A:
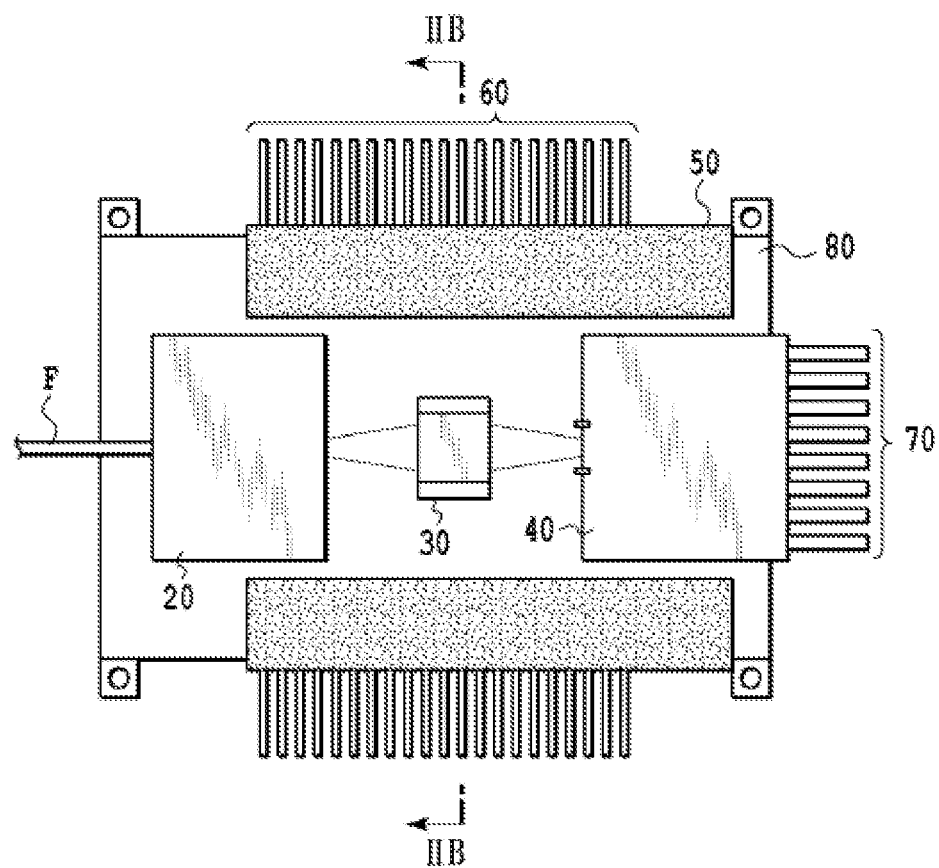
FIG. 2A is a view illustrating an optical module employing a conventional package for optical module.
Figure 2B:
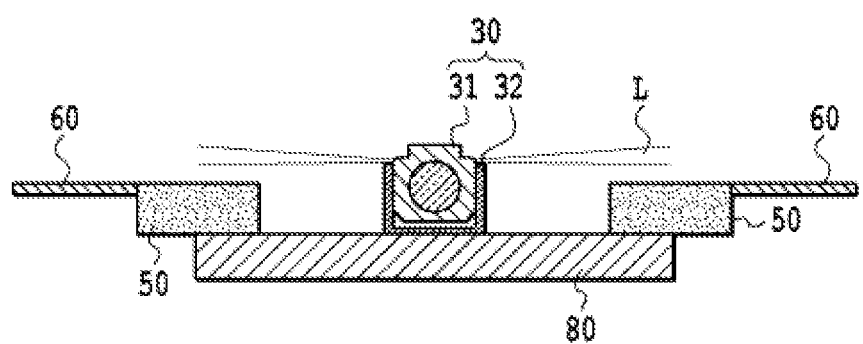
FIG. 2B is a IIB-IIB cross-sectional view of FIG. 2A.
Figure 3A:
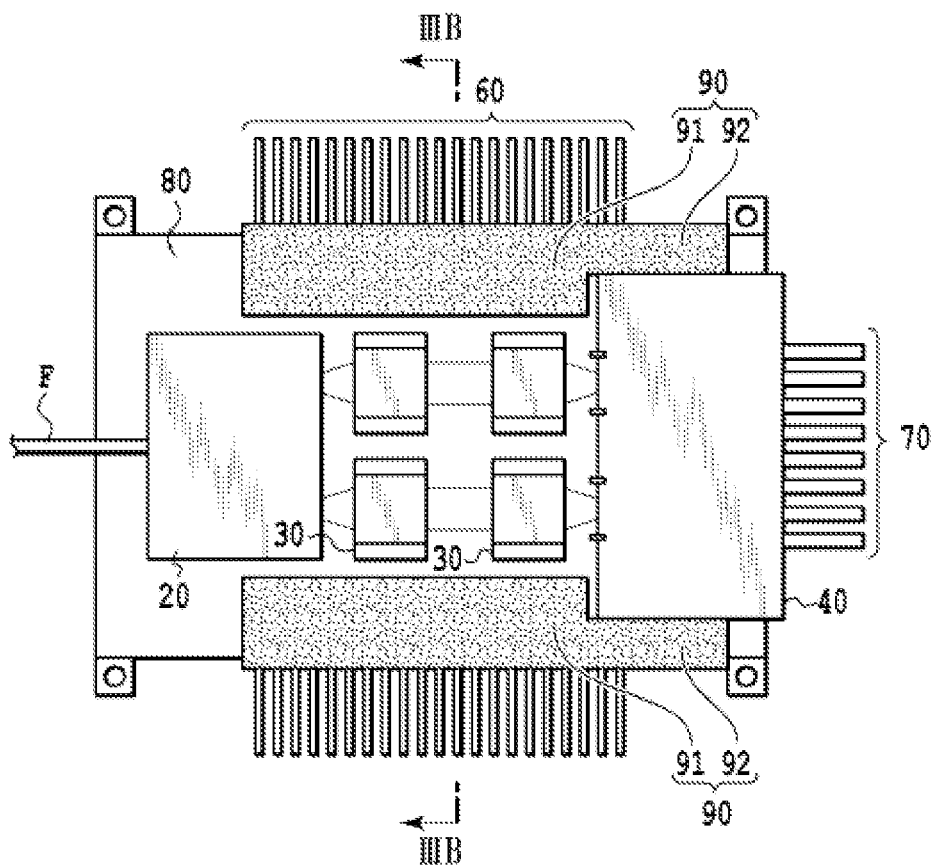
FIG. 3A is a view illustrating an optical module employing a conventional package for optical module.
Figure 3B:
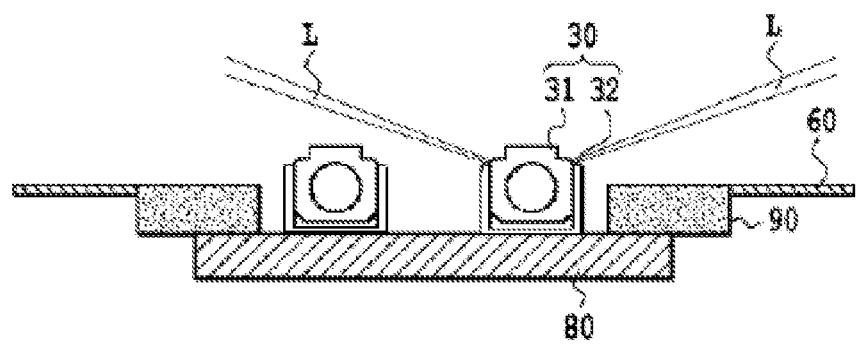
FIG. 3B is a IIIB-IIIB cross-sectional view of FIG. 3A.
Figure 4A:
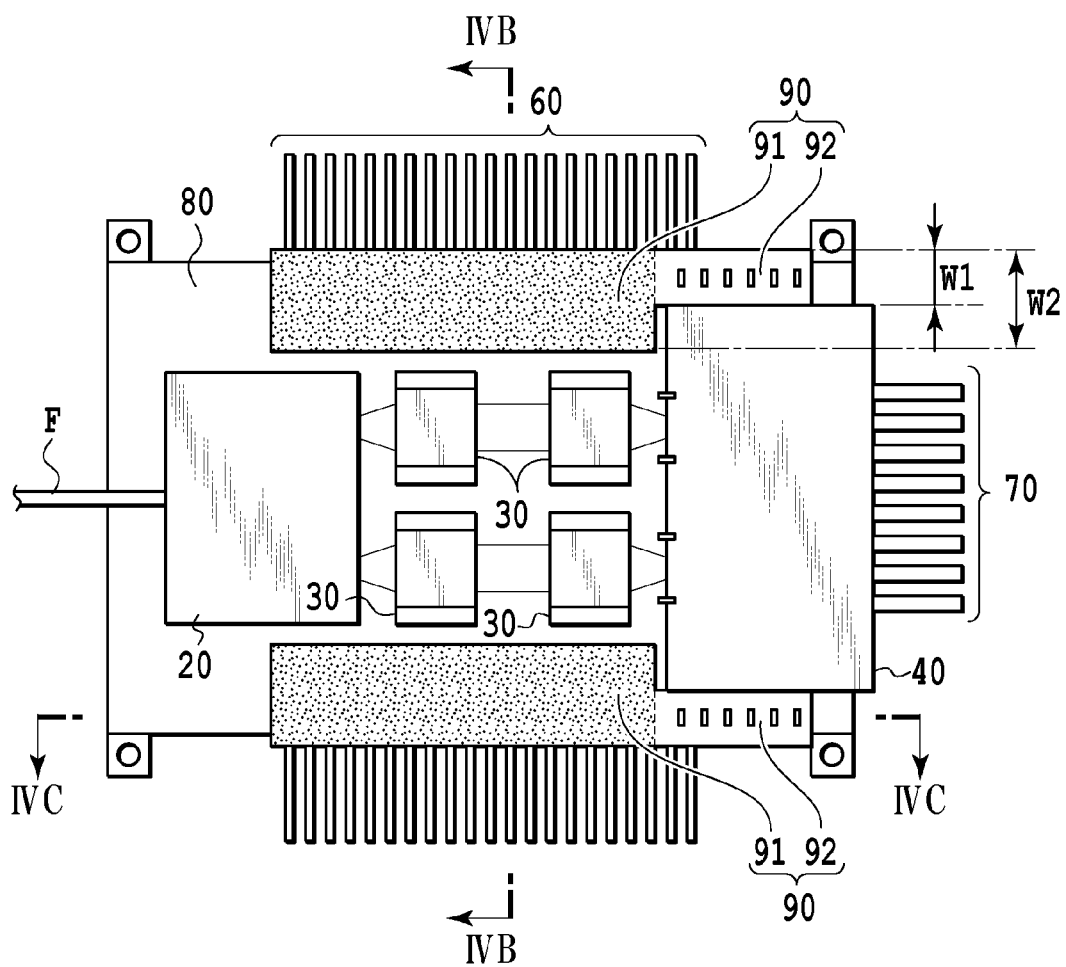
FIG. 4A is a view illustrating an optical module employing a package for optical module of a first embodiment.
Figure 4B:
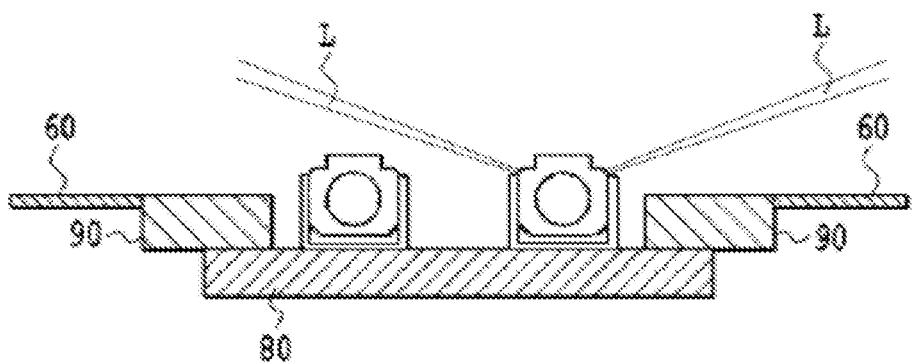
FIG. 4B is a IVB-IVB cross-sectional view of FIG. 4A.
Figure 4C:
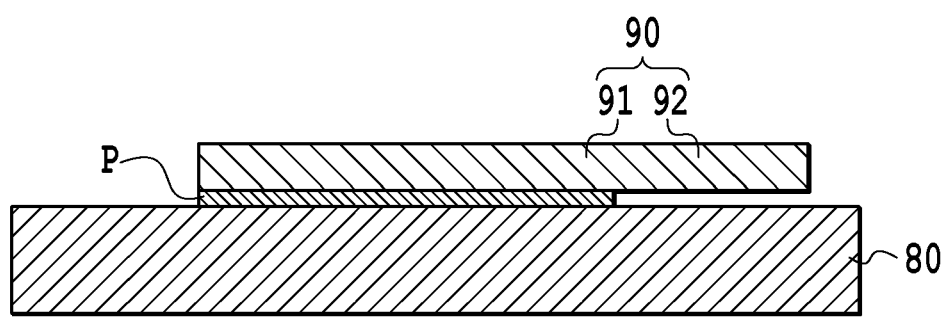
FIG. 4C is a IVC-IVC cross-sectional view of FIG. 4A.

Hereinafter, embodiments of the present invention are described in details.
(First Embodiment)
FIGS. 4A to 4C are views illustrating an optical module employing a package for optical module of the present embodiment. FIG. 4A is a top view, FIG. 4B is a IVB-IVB cross-sectional view, and FIG. 4C is a IVC-IVC cross-sectional view. As illustrated in FIG. 4A, the optical module is configured such that a waveguide optical element 20, an optical component 30, an optical semiconductor and electronic circuit 40, and the like are mounted on an upper surface of a flat-plate-shaped package base 80. Two opposed side portions of the upper surface of the package base 80 are provided with ceramic circuit boards 90 each having multiple DC leads 60 connected thereto, and two opposed side portions of the upper surface orthogonal to the above side portions are provided with a fiber F serving as an optical input terminal, and output terminals 70. The package base 80 is covered with a box-shaped lid (not illustrated) from the upper side, and is packaged into an optical module.

For the package base 80, a body made of a metal such as Kovar and having a surface plated with Ni can be used. The term, flat-plate-shaped means that side walls, which may be obstacles to YAG laser welding, do not exist on the periphery of the package base, as illustrated in FIG. 4B. Hence, the package base 80 is not limited to a flat base, but may have a projecting or depressing structure.

The multiple DC leads 60 are terminals for inputting electric signals for drive control of the components mounted inside the package 80. These multiple DC leads 60 are arranged on one end of each ceramic circuit board 90 along its longitudinal direction.

The ceramic circuit board 90 includes a wiring pattern portion 91 in which a writing pattern for routing signals inputted from the multiple DC leads 60 is formed, and a pad portion 92 provided with a pad serving as a connection unit to supply the routed input signals to the optical semiconductor and electronic circuit 40 in conjunction with the wiring pattern. In order to connect the pad portions 92 to the optical semiconductor and electronic circuit 40 by bonding, the pad portions 92 are arranged on both sides of the optical semiconductor and electronic circuit 40. In this embodiment, the optical semiconductor and electronic circuit 40 are arranged over a region with a large width, and accordingly a width W1 set for the pad portion 92 is not very large. On the other hand, a large width W2 is set for the wiring pattern portion 91, because necessary wiring routing is carried out.

As described above, the width of the ceramic circuit board 90 is changed along the longitudinal direction at a boundary portion between the wiring pattern portion 91 and the pad portion 92. In other words, the ceramic circuit board 90 has a first portion where the shape is changed along the longitudinal direction. In the present embodiment, a region of the ceramic circuit board 90 not having the first portion, i.e., a region not having the boundary portion between the wiring pattern portion 91 and the pad portion 92, is fixed by soldering to the package base 80 which is a metal base. In the example illustrated in FIGS. 4A and 4C, only the wiring pattern portion 91 is joined. FIG. 4A illustrates a dotted portion in the ceramic circuit board 90 as a joint region, and FIG. 4C illustrates a soldering material P provided in the joint region. The joint region only has to be a region not having the boundary portion between the wiring pattern portion 91 and the pad portion 92, and may be a region smaller than the region illustrated in FIG. 4A, or may be a region only including the pad portion 92. However, the larger joint area, the more preferable. This is because a larger joint area produces higher bonding power. With this structure, even if the metal base after soldering is distorted with its bottom surface warped convexly, there is no risk that the ceramic circuit boards 90 will be broken by receiving tensile stress.

As the soldering material P used for the soldering, solder joint of AuSn which is a low-temperature soldering material can be employed. Use of AuSn of the low-temperature soldering material is preferable, because only the ceramic circuit boards 90 can be plated with gold in advance, and a process of removing gold plating on the upper surface of the metal base 80 can be omitted, although the removal process is otherwise necessary to mount the optical components 30. Incidentally, if SnCu is used as the soldering material, the soldering needs to be performed at such a high temperature that a gold plating process needs to be performed also on the metal base after the soldering. However, in the case of AuSn soldering, the gold plating process can be performed on the ceramics independently of the base metal, and the optical mounting can be made easier. In this case, after the AuSn soldering, there is a high risk that a crack may occur in the ceramics due to generation of tensile stress in the ceramics in board mounting, because the base metal is deformed convexly. However, the structure in which only some regions of the ceramics are joined can offer the reliability, and is particularly effective.

In order to be subjected to AuSn soldering, the package base 80 is formed of a body made of a metal such as Kovar and having a surface plated with Ni, and surface areas of the package base 80 to be joined to the ceramic circuit boards 90 are provided with patterns of gold plating. The AuSn soldering is performed by using a AuSn solder sheet with a thickness of 50 μm.

According to the package for optical module of the present embodiment, it is possible to provide an optical module package which is capable of achieving high-density layout, and which is also made highly reliable by reducing stress concentration and thereby preventing occurrence of a crack in ceramic circuit boards even when thermal expansion occurs or in the case where stress due to board mounting is applied.

(Second Embodiment)

Instead of employing a mode where the ceramic circuit board 90 of the first embodiment forms the first portion by changing its width along the longitudinal direction, this embodiment employs a mode where a ceramic circuit board 100 forms a first portion by changing its thickness along the longitudinal direction. The other part of the structure is the same as that in the first embodiment, and the explanation thereof is omitted herein.

Figure 5A:
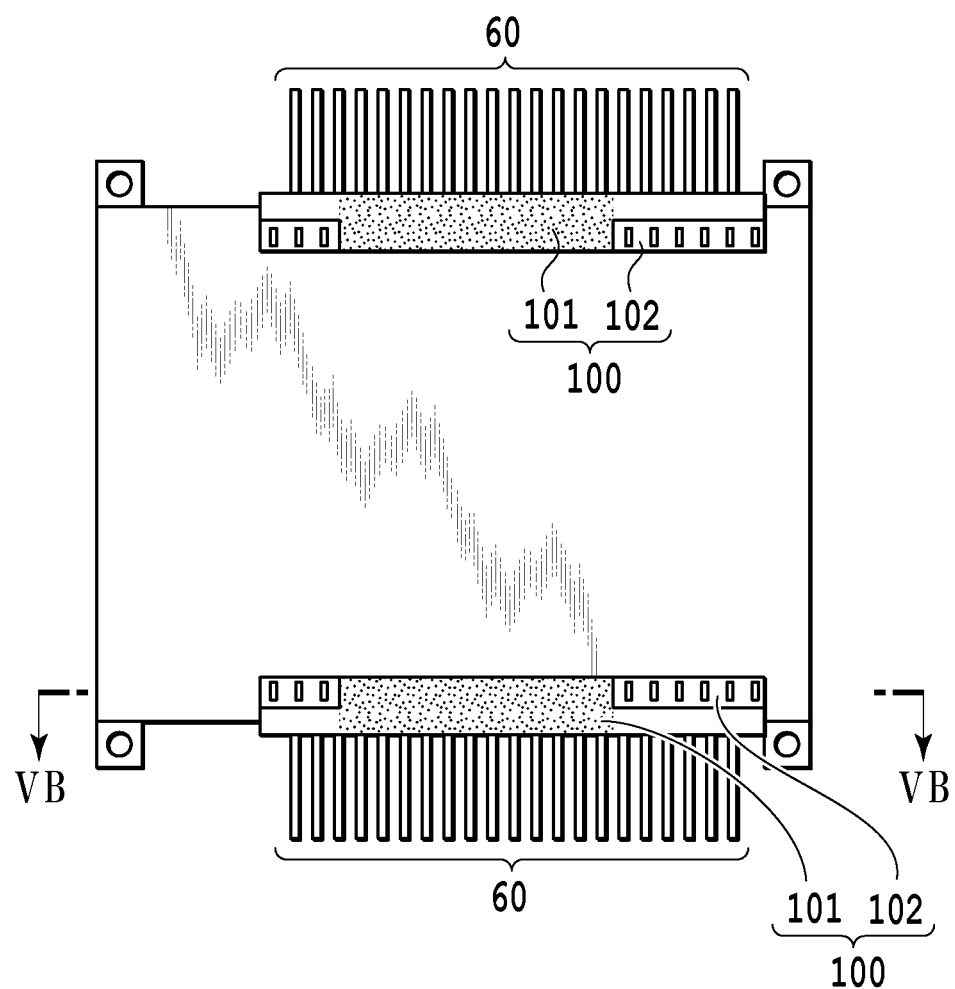
FIG. 5A is a view illustrating an optical module employing a package for optical module of a second embodiment.
Figure 5B:
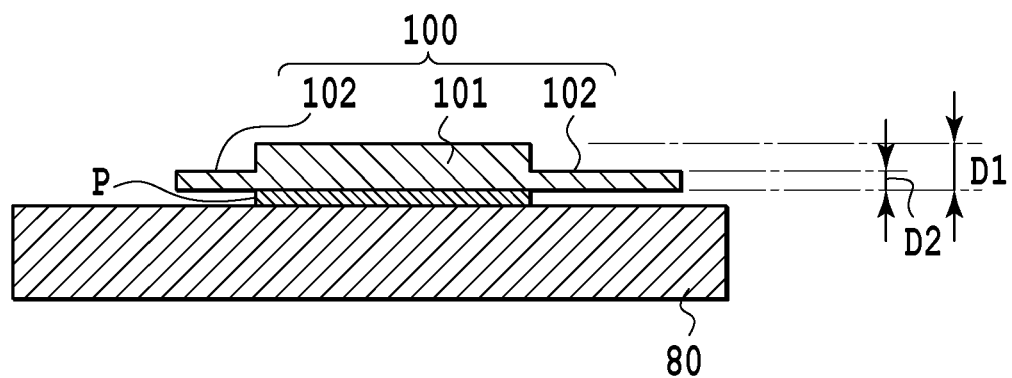
FIG. 5B is a VB-VB cross-sectional view of FIG. 5A.

The ceramic circuit board 100 is configured with a width constant along the longitudinal direction, but with a larger thickness D1 of a wiring pattern portion 101 than a thickness D2 of a pad portion 102, because the wiring pattern portion 101 is formed of multiple layers. Thus, regions where the pad portions 102 are located in the width direction are changed in thickness along the longitudinal direction, and therefore are not used for joining. Then, only a region not having the pad portion 102 in the width direction is used for joining. As illustrated in FIG. 5A, dotted portions in the ceramic circuit boards 100 are presented as joint regions.

According to the package for optical module of the present embodiment, even if ceramic circuit boards changed in thickness along the longitudinal direction are used, it is possible to provide an optical module package which is capable of achieving high-density layout, and which is also made highly reliable by reducing stress concentration and thereby preventing occurrence of a crack in ceramic circuit boards even when thermal expansion occurs or in the case where stress due to board mounting is applied.

The foregoing embodiments have each been described above by taking as an example the case where ceramic circuit boards are changed in width or thickness along the longitudinal direction at the boundary between the wiring pattern portion 91, 101 and the pad portion 92, 102. However, instead of these cases, a boundary where the width or thickness is changed may exist inside the wiring pattern portion 91, 101 or the pad portion 92, 102. In this case, a region having the boundary where the width or thickness is changed in the longitudinal direction is not used as the joint region.

In addition, although the receiver modules have been described in the foregoing embodiments, the present invention can be applied to a transmitter module by replacing the components to be mounted with components for a transmitter.

REFERENCE SIGNS LIST

10 bathtub-shaped package
20 waveguide optical element
30 optical component
40 optical semiconductor and electronic circuit
60 DC lead
70 output terminal
80 package base
90, 100 ceramic circuit board
91, 101 wiring pattern portion
92, 102 pad portion
F fiber

The invention claimed is:

1. A package for an optical module comprising:
a metal base in a shape of a flat-plate; and
a ceramic circuit board in which a plurality of terminals are arranged in a longitudinal direction, the ceramic circuit board including a wiring pattern portion and a pad portion, wherein
the ceramic circuit board includes a first portion in which the ceramic circuit board is changed in shape along the longitudinal direction,
at least a portion of only the wiring pattern portion is joined to an upper surface of the metal base by soldering, and
the first portion is not joined to the upper surface of the metal base by soldering.

2. The package for the optical module according to claim 1, wherein the first portion of the ceramic circuit board is a portion where a width is changed along the longitudinal direction.

3. The package for the optical module according to claim 1, wherein the first portion of the ceramic circuit board is a portion where a thickness is changed along the longitudinal direction.

4. The package for the optical module according to claim 1, wherein a soldering material used for the soldering is an AuSn solder.

5. The package for the optical module according to claim 1, wherein the first portion is between the pad portion and the wiring pattern portion.

* * * * *